United States Patent [19]

Homma et al.

[11] Patent Number: 4,794,445
[45] Date of Patent: Dec. 27, 1988

[54] SEMICONDUCTOR DEVICE

[75] Inventors: Hideo Homma, Hitachi; Yutaka Misawa, Katsuta; Naohiro Momma, Hitachi, all of Japan

[73] Assignee: Hitachi, Ltd., Tokyo, Japan

[21] Appl. No.: 78,999

[22] Filed: Jul. 29, 1987

[30] Foreign Application Priority Data

Jul. 31, 1986 [JP]  Japan .................. 61-178890

[51] Int. Cl.⁴ ............... H01L 23/08; H01L 23/54
[52] U.S. Cl. ............................ 357/71; 357/67; 357/55; 357/49
[58] Field of Search .............. 357/54, 49, 55, 67, 357/71

[56]  References Cited
U.S. PATENT DOCUMENTS 4,649,411  3/1987  Birrittella .................. 357/54

FOREIGN PATENT DOCUMENTS 0040071  3/1977  Japan .................. 357/55
0064881  5/1977  Japan .................. 357/55
0027645  2/1980  Japan .................. 357/67

Primary Examiner—Andrew J. James
Assistant Examiner—Sheila V. Clark
Attorney, Agent, or Firm—Antonelli, Terry & Wands

[57]  ABSTRACT

A semiconductor device has a structure in which two semiconductor substrates are coupled to each other through a semiconductor oxide film and a metal silicide film, and a semiconductor element, for example, a bi-polar transistor is formed in the semiconductor substrate on the metal silicide film side, whereby a metal silicide layer having a high melting point is provided beneath one region of the bi-polar transistor for example, an n+buried collector layer and in ohmic contact with the n+buried collector layer. An electrical isolation between the adjacent semiconductor elements is made by an insulating layer.

24 Claims, 3 Drawing Sheets

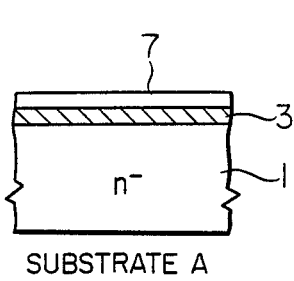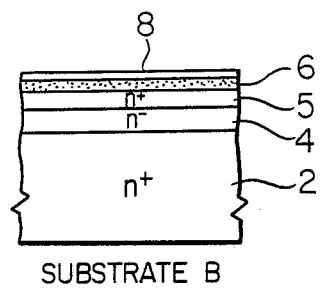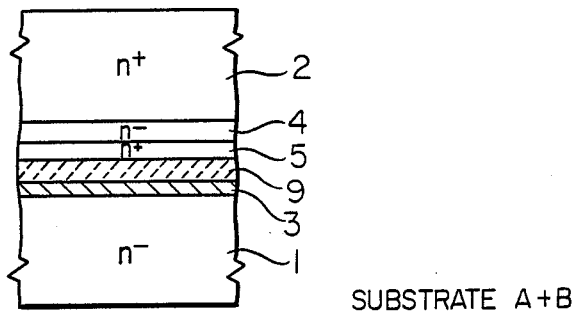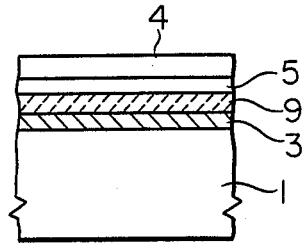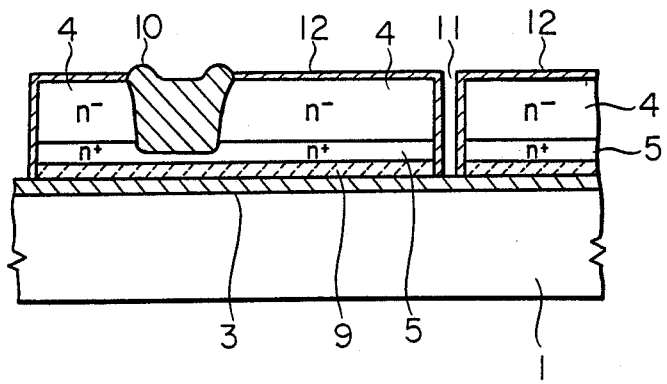

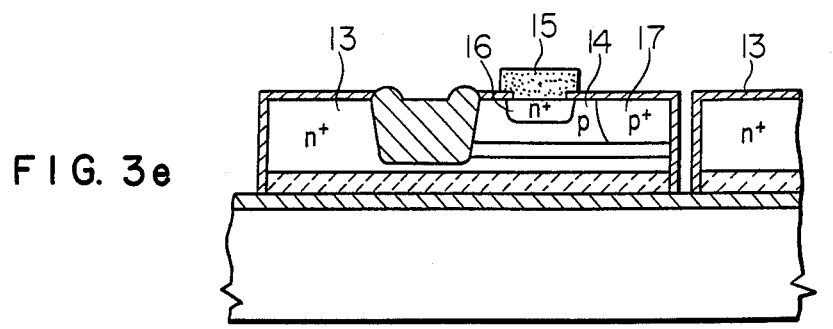
FIG. 3e
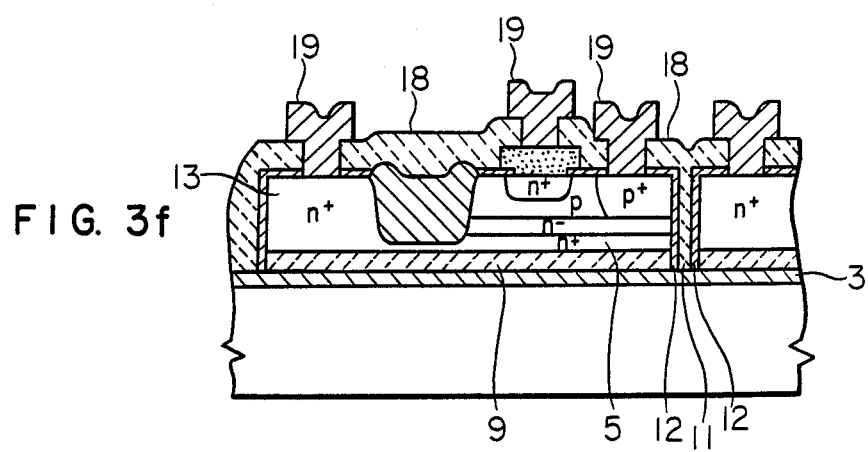
FIG. 3f
FIG. 4
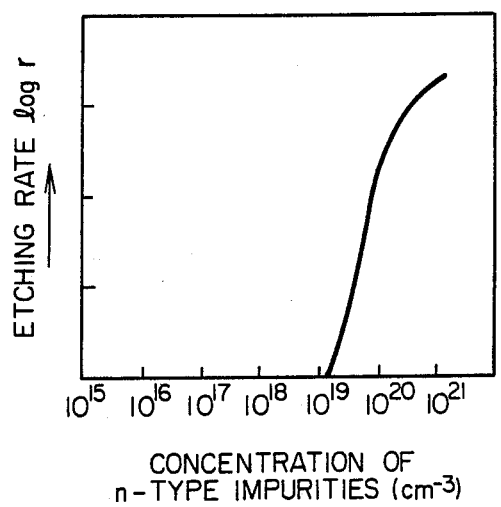

SEMICONDUCTOR DEVICE

BACKGROUND OF THE INVENTION

The present invention relates to a semiconductor device, and more particularly to a semiconductor device having a bi-polar transistor suitable for high speed operation and high density integration.

An example of a prior art concerning a semiconductor device including a bi-polar transistor is disclosed in Japanese patent application JP-A-59-80968. In a semiconductor device according to the disclosed prior art, a collector region is formed by a highly doped layer of n conductivity type buried in a substrate and an isolation between device elements such as transistors is made by the combination of a pn junction and a thick silicon oxide (hereinafter referred to as $SiO_2$) film formed by means of selective oxidation.

FIG. 1 shows a cross-sectional structure of a bi-polar transistor included in the semiconductor device according to the above-mentioned art. In the figure, reference numeral 30 designates a silicon substrate of $p^-$ type, numeral 31 a buried collector layer of $n^+$ type, numeral 32 a $p^+$ for isolation between device elements, numeral 33 a region for isolation between device elements, numeral 34 an emitter, numeral 35 a base layer, and numeral 36 an $SiO_2$ film. This bi-polar transistor is constructed in such a manner that the $n^+$ buried collector layer 31, the base layer 35 and the emitter layer 34 are formed successively in that order on the $p^-$ substrate 30 and the inter-element isolation region 33 including the $p^+$ isolation layer 32 and the $SiO_2$ film 36 is provided between the adjacent device elements.

In general, a collector series resistance $r_{CS}$ of the bi-polar transistor is an important factor in implementing a device of high speed. Namely, when the collector series resistance $r_{CS}$ is high, it is difficult to operate the transistor at a high speed since the gain-bandwidth product $f_T$ is lowered and the transistor is liable to its saturated state in a large-current region. Therefore, it is necessary to maintain the collector series resistance $r_{CS}$ at a sufficiently low value. The collector series resistance $r_{CB}$ of the conventional bi-polar transistor shown in FIG. 1 is formed by a series resistance including a resistance $r_{CS1}$ between a collector layer pulling region and the $n^+$ buried collector region 31, a resistance $r_{CS2}$ of the $n^+$ buried collector layer 31, and a resistance $r_{CS3}$ between the $n^+$ buried collector layer 31 and a lightly doped collector layer of $n^-$ type, as is shown in the figure. A dominant resistance component which determines the magnitude of the collector series resistance $r_{CS}$, is the resistance $r_{CS2}$ or the resistance of the $n^+$ buried collector layer 31. Usually, the sheet resistance of the $n^+$ buried layer which is formed by doping with a donor type impurity such as Sb or As, has a magnitude on the order of 100 $\Omega/\square$. With reduction in the size of device elements such as transistors formed in a semiconductor device, it is required to further narrow the depth of the $n^+$ buried collector layer in a direction of its thickness. Accordingly, the semiconductor device shown in FIG. 1 has a problem in that if high density is desired with respect to a structure, the collector series resistance $r_{CS}$ is effectively increased, thereby making high speed operation of the device difficult.

Also, in the above-mentioned conventional semiconductor device, if the width d of the isolation between the adjacent device elements formed by the combination of the $SiO_2$ film 36 and the pn junction is designed to have a small value, the application of a negative bias to the collector layer results in a punch-through effect or may result in the depletion of the $p^+$ isolation layer 32 provided in the inter-element isolation region 33, thereby rendering a conductive state between the adjacent buried collector layers of $n^+$ and $n^+$. Therefore, it is necessary to make the width d of the inter-element isolation region 33 larger than necessary, i.e., larger than a distance at which no punch-through of the $p^+$ isolation layer 32 takes place. Accordingly, the conventional semiconductor device has the problem wherein the fine delineation of the inter-element isolation width is difficult to achieve and hence a high integration of the device cannot be achieved.

Further, the above-mentioned prior art has a further problem wherein a relatively large electrostatic capacitance is produced as a result of the pn junction between the $p^+$ isolation layer 32 and the $n^+$ buried collector layer 31 and this pn junction increases the electrostatic capacitance between the collector and the substrate, thereby making the operation speed of the semiconductor device slow.

SUMMARY OF THE INVENTION

An object of the present invention is to provide a bi-polar type semiconductor device suitable for high speed and high integration by providing a semiconductor device structure by which the above-mentioned problems of the prior art are solved, the collector series resistance $r_{CS}$ as well as the electrostatic capacitance between the collector and the substrate can be made sufficiently small and the isolation width d between device elements can be set to a sufficiently small value.

A first feature of the present invention is that two semiconductor substrates are coupled to each other through a semiconductor oxide film and a metal silicide film and a semiconductor element is formed in the semiconductor substrate on the metal silicide film side, whereby a metal silicide layer having a high melting point is provided beneath one region of the semiconductor element such as a bi-polar transistor, for example, an $n^+$ buried collector layer, and in ohmic contact with the $n^+$ buried collector layer.

A second feature of the present invention is that two semiconductor substrates are coupled to each other through a semiconductor oxide film and a metal silicide film, a semiconductor element is formed in the semiconductor substrate on the metal silicide film side, one region of the semiconductor element is connected to the metal silicide film, a plurality of such semiconductor elements are formed, and the adjacent elements are isolated from each other by an insulating layer.

The metal silicide layer provided beneath the $n^+$ buried collector layer is connected to the collector layer in ohmic contact therewith. Therefore, the value of the collector series resistance $r_{CS}$ is determined by the sheet resistance of the metal silicide layer and hence can be greatly reduced in comparison with the case of the prior art. For example, in the case where a tungsten silicide ($WSi_2$) layer having a thickness of 3500 Å, the sheet resistance of the silicide layer is about 2 $\Omega/\square$ which is about one fiftieth of the sheet resistance of the $n^+$ buried collector layer in the case of the prior art. Thereby, the value of the collector series resistance $r_{CS}$ is also reduced to a similar extent and hence a high speed operation of the device is possible. Further, since the adjacent device elements are isolated from each other by only the insulating layer, the problem of punch-through in case of the isolation using a pn junction according to the prior art is not encountered so that the isolation width between the device elements can be made small and at a value determined by the breakdown strength of the insulating layer. Thus, high integration of elements in the semiconductor device can be easily attained.

BRIEF DESCRIPTION OF THE DRAWINGS

FIGS. 3a to 3f are vertical cross-sectional views for respectively explaining the steps for fabrication of the semiconductor device shown in FIG. 2; and FIG. 4 is a view for explaining the etching characteristic of an etchant used in the fabrication step.

DESCRIPTION OF THE PREFERRED EMBODIMENTS

An embodiment of a semiconductor device according to the present invention will now be explained in detail by virtue of the accompanying drawings.

Figure 2:
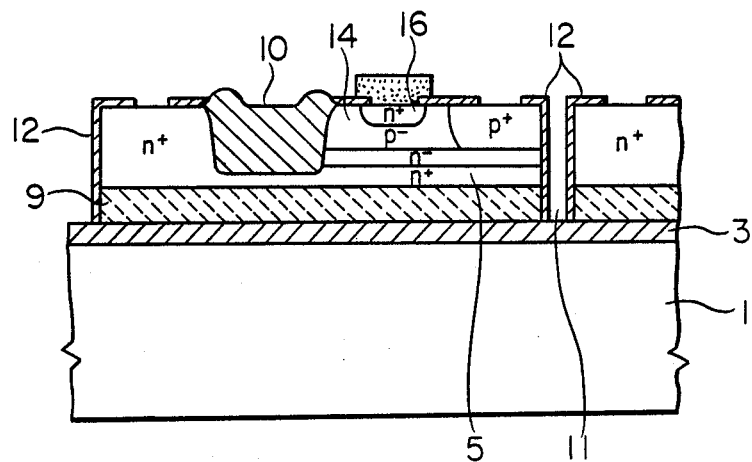
FIG. 2 is a vertical cross-sectional view of a semiconductor device according to an embodiment of the present invention.

In the drawings, FIG. 2 shows a vertical cross-sectional view of a multi-region type semiconductor device, such as, a NPN type bipolar transistor, according to an embodiment of the present invention, FIGS. 3a to 3f are vertical cross-sectional views of the semiconductor device at respective fabrication steps thereof, and FIG. 4 shows a view for explaining a relationship between the concentration of an n-type impurity in silicon and the silicon etching rate for an etchant used in the fabrication step. In FIGS. 2 and 3, reference numeral 1 designates an n⁻ silicon substrate, numeral 2 an n+ silicon substrate, numeral 3 an SiO₂ film, numeral 4 a monocrystalline silicon layer, numeral 5 an n+ collector layer, numeral 6 a polycrystalline silicon film, numerals 7 and 8 Mo films, numeral 9 an MoSi₂ layer, numerals 10 and 12 SiO₂ films, numeral 11 an inter-element isolation region, numeral 13 a collector layer pulling region, numeral 14 a base region, numeral 15 an emitter electrode, numeral 16 an emitter region, numeral 17 a base drawing region, numeral 18 a phosphosilicate glass PSG film, and numeral 19 an electrode wiring layer.

A bi-polar transistor which is the semiconductor device according to the present invention, is constructed in such a manner that as shown in FIG. 2, the SiO₂ film 3, the metal silicide (MoSi₂) layer 9, the n+ collector layer 5 of high impurity concentration connected to the metal silicide layer 9 in ohmic contact therewith, the base layer 14 and the emitter layer 16 are laminated successively in that order on the n⁻ silicon substrate 1, and an insulating layer including the SiO₂ film 12 and the PSG film is provided as an inter-element isolation region between the adjacent device elements.

Next, the steps for fabrication of the semiconductor device shown in FIG. 2 will be explained by use of FIGS. 3a to 3f which show vertical cross sections for the respective fabrication steps.

Figure 1:
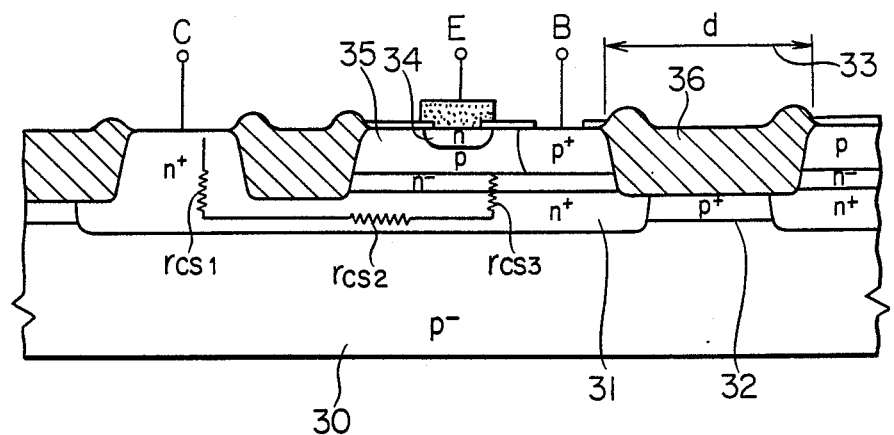
FIG. 1 is a vertical cross-sectional view of a semiconductor device according to the prior art.

As shown in FIG. 3a-1, a substrate A is fabricated in which an SiO₂ film 3 of about 5000 Å thickness is disposed on an n⁻ silicon substrate 1 having an impurity concentration of $10^{15}$ cm$^{-3}$ and an Mo film 7 of 1500 Å is disposed on the SiO₂ film 3. On the other hand, as shown in FIGS. 3a-2, a substrate B is fabricated in which a monocrystalline silicon layer 4 having an impurity concentration on the order of $10^{17}$ cm$^{-3}$ is epitaxially grown on an n+ silicon substrate 2 having an impurity concentration of $2\times10^{20}$ cm$^{-3}$, an n+ collector layer 5 is thereafter formed by implanting ions of As, and a polycrystalline silicon film 6 of about 5500 Å thickness and an Mo film 8 of 500 Å thickness are successively provided on the n+ collector layer 5.

By carrying out a heat treatment at about 900° C. in a state where the surfaces of the substrates A and B having the Mo films 7 and 8 respectively are disposed into close contact under pressure with each other, the Mo films 7 and 8 react with the polycrystalline silicon film 6, thereby forming an MoSi₂ film 9 of about 4500 Å thickness (see FIG. 3b).

After a resist, such as Si₃N₄ film (not shown) is formed on each of the side faces of the laminate of the substrates A and B thus secured to each other, for masking the silicide exposed at the side faces, etching is carried out by using an etchant having a component ratio of HF:HNO₃:CH₃COOH=1:3:16 to remove only the n+ silicon substrate 2 (see FIG. 3c). Since the etchant used has an etching characteristic exhibiting such an etching rate for an n-type impurity concentration as shown in FIG. 4 and can selectively etch away only n conductivity type silicon of high impurity concentration, it is possible to leave the n⁻ epitaxial layer 4 by self-selection.

Next, an SiO₂ film 10 is deposited by selective oxidation. Thereafter, the n⁻ monocrystalline silicon layer 4, the n+ collector layer 5 and the MoSiO₂ film 9 are removed thereby forming a groove by a usual dry etching method to form an inter-element isolation region 11. Then, the entire surface of the substrate is oxidized to form an SiO₂ film 12 (see FIG. 3d).

Thereafter, a collector layer pulling region 13 is formed through selective implantation of As ions and heat treatment and a base region 14 is then formed through selective implantation of B ions and heat treatment. Further, after selectively removing a portion of the SiO₂ film in a region where an emitter is to be formed, a polycrystalline silicon film is deposited on the entire surface of the resultant structure. Ions of As are implanted into the polycrystalline silicon film and the structure is subjected to a heat treatment to form an emitter region 16. Then, the polycrystalline silicon film is selectively worked to provide an emitter electrode 15. Thereafter, a base drawing region 17 is formed through selective implantation of B ions and heat treatment (see FIG. 3e).

Next, a PSG film 18 is provided on the entire surface of the resulting structure. By selectively removing the PSG film 18 and the SiO₂ film 12, a throughhole is formed on each region of the collector, emitter and base. Thereafter, a conductive film made of, for example, Al is deposited on the entire surface of the structure and then selectively etched to provide an electrode wiring layer 19 (see FIG. 3f).

In this manner, a bi-polar type transistor can be obtained which is a semiconductor device according to the present invention.

In the bi-polar type semiconductor device according to the above-mentioned embodiment of the present invention, since the n+ collector layer 5 of high impurity concentration and the collector pulling region 13 are connected to the underlying MoSi₂ film 9 in ohmic contact therewith, the collector series resistance $r_{CS}$ can be made small to a value which is substantially determined by the sheet resistance 2 $\Omega/\square$ of the MoSi$_2$ film 9. Accordingly, in this semiconductor device, saturation while operating at the large-current region of its characteristic can be inhibited and the gain-bandwidth product $f_T$ can be effectively increased, thereby enhancing the operating speed of the device. Further, since the inter-element isolation region 11 is provided by an insulating layer which includes the SiO$_2$ film 12 and the PSG film 18, the width of the isolation region 11 can be made small to a value determined by the breakdown strength of the insulating films 12 and 18. Furthermore, since the inter-element isolation region has no pn junction, an electrostatic capacitance between the collector and substrate can be made small. Therefore, high speed operation, high integration and high density can be easily attained in the device according to the abovementioned embodiment.

In the foregoing embodiment, the MoSi$_2$ film 9 has been provided as a metal silicide film beneath the n+ collector layer 5 of high impurity concentration and the collector pulling region 13. However, the metal silicide film may be made of WSi$_2$ or TiSi$_2$. Any other material can be used for the metal silicide film so long as the material is a metal silicide having a high melting point and a low resistance. Since the features of the present invention are to reduce the collector series resistance $r_{CS}$ by providing a low resistance material beneath the collector layer and to implement high integration of the device by isolating the device elements from each other by means of an insulating layer, similar effects can also be attained even if any difference in structure except the just-mentioned features exists or even if any difference in fabrication method exists, for example, the isolation between the collector 13 and the base 14 may be achieved by forming a thin film of SiO$_2$ in a narrow slot disposed therebetween in place of the SiO$_2$ layer 10 used in the illustrated embodiment.

As has been explained, according to the present invention, the collector series resistance $r_{CS}$ can be reduced to a value equal to or smaller than (one)/(several tens) of the collector series resistance in the conventional device and the effective electrostatic capacitance between the collector and the substrate can be also reduced significantly. Therefore, device of high speed is attained. The isolation between device elements is made by means of an insulating layer. Therefore, a device of high integration and high density capability can be easily attained.

What is claimed is:

1. A semiconductor device comprising a semiconductor substrate, an insulating layer formed on a main surface of said semiconductor substrate and a plurality of monocrystalline/metal-silicide islands formed on said insulating layer, said islands being isolated from one another with an insulating region between each pair of said islands, each island including a metal-silicide layer disposed over a portion of said insulating layer, a monocrystalline layer formed on said metal-silicide layer and a semiconductor element formed into said monocrystalline layer.

2. A semiconductor device according to claim 1, wherein said semiconductor element is a bi-polar transistor the collector region of which is connected to said metal silicide layer.

3. A semiconductor device according to claim 2, wherein said collector region includes a buried layer which is in ohmic contact with a corresponding metal-silicide layer and wherein respective base and emitter regions are formed vertically thereover.

4. A semiconductor device according to claim 3, wherein said collector region further including a collector pulling region extending from said metal-silicide layer, in the same direction as said vertically formed region, to a semiconductor device surface, said collector pulling region having a narrow arm in ohmic contact with said metal-silicide layer extending to said buried layer thereby effecting in a vertically formed bipolar transistor such that said collector, base and emitter regions have contact surfaces for respective collector, base and emitter electrodes along a planar surface of said semiconductor device.

5. A semiconductor device according to claim 4, wherein said collector pulling region is separated from said vertically formed bipolar transistor regions via an insulating region which extends from said narrow arm to said semiconductor device surface.

6. A semiconductor device according to claim 4, wherein each respective insulating region for effecting isolation between respective monocrystalline/metal-silicide islands is a grooved region extending from the surface of said semiconductor device to said insulating layer.

7. A semiconductor device according to claim 6, wherein said insulating regions and said insulating layer are comprised of a silicon oxide film.

8. A semiconductor device according to claim 6, wherein each said grooved region includes silicon oxide film layers separated by a PSG film.

9. A semiconductor device according to claim 4, wherein said collector, base and emitter regions are formed via selective ion implantations.

10. A semiconductor device according to claim 9, wherein said bi-polar transistor is an NPN type transistor.

11. A semiconductor device according to claim 8, wherein said collector, base and emitter regions are formed via selective ion implantations.

12. A semiconductor device according to claim 11, wherein said bi-polar transistor is an NPN type transistor.

13. A semiconductor device according to claim 12, wherein the width of said grooved region has a value in accordance with the breakdown strength characteristic of the insulation effected therein.

14. A semiconductor device according to claim 13, wherein said metal-silicide layer is comprised of a material having a high melting point and a low effective sheet resistance.

15. A semiconductor device according to claim 14, wherein said silicide layer is comprised of one of MoSi$_2$, WSi$_2$ and TiSi$_2$.

16. A semiconductor device for effecting high speed operation and facilitating high density integration, comprising a semiconductor substrate, an insulating layer formed on a main surface of said substrate, a plurality of semiconductor islands for forming therein respective multi-region type semiconductor elements in a monocrystalline layer, said islands being formed over said insulating layer and being respectively separated from each other by individual inter-element isolation regions, wherein each island includes a metal-silicide layer extending over the entire area of said island and formed on said insulating layer, one of the regions of a respective semiconductor element being formed on and in ohmic contact with said metal-silicide layer and the remaining regions of said element being formed thereover such that there results in a plurality of isolated semiconductor elements having contact surfaces along the same surface of said semiconductor device.

17. A semiconductor device according to claim 16, wherein each inter-element isolation region is a grooved region extending from said semiconductor device surface to said insulating layer.

18. A semiconductor device according to claim 17, wherein at least one of said semiconductor islands includes a bi-polar transistor wherein the monocrystalline layer is comprised of a collector having a buried layer region and a pulling region thereby effecting contact with a collector electrode on the same semiconductor device surface as with respect to the base and emitter region contact surfaces.

19. A semiconductor device according to claim 18, wherein said metal-silicide layer is comprised of a material having a high melting point and a low effective sheet resistance.

20. A semiconductor device according to claim 19, wherein said silicide layer is comprised of one of $MoSi_2$, $WSi_2$ and $TiSi_2$.

21. A semiconductor device according to claim 20, wherein each said grooved region and said insulating layer is comprised of $SiO_2$ film.

22. A semiconductor device according to claim 21, wherein each said grooved region includes a layer of $SiO_2$ film and a film of PSG.

23. A semiconductor device according to claim 22, wherein the width of said grooved region has value in accordance with the breakdown strength characteristic of the insulation effected therein.

24. A semiconductor device according to claim 17, wherein the width of said grooved region has value in accordance with the breakdown strength characteristic of the insulation effected therein.

* * * * *